United States Patent [19]

Guterman

[11] Patent Number: 4,590,504
[45] Date of Patent: May 20, 1986

[54] NONVOLATILE MOS MEMORY CELL WITH TUNNELING ELEMENT

[75] Inventor: Daniel C. Guterman, Plano, Tex.

[73] Assignee: Thomson Components - Mostek Corporation, Carrollton, Tex.

[21] Appl. No.: 454,056

[22] Filed: Dec. 28, 1982

[51] Int. Cl.$^4$ .............................................. H01L 29/78
[52] U.S. Cl. ..................... 357/23.11; 357/45; 357/49; 357/50; 357/59; 357/4; 357/23.14; 357/23.6; 357/23.9; 357/23.5
[58] Field of Search ............... 357/23.11, 45, 59, 50, 357/49, 4, 23.14, 23.6, 23.9, 23.5

[56] References Cited

U.S. PATENT DOCUMENTS

| | | | |
|---|---|---|---|
| 4,023,195 | 5/1977 | Richman | 357/23.11 |
| 4,432,006 | 2/1984 | Takei | 357/23.6 |
| 4,451,904 | 5/1984 | Sugiura et al. | 357/23.5 |
| 4,489,338 | 12/1984 | Voncken | 357/23.6 |

FOREIGN PATENT DOCUMENTS

WO81/02493  9/1981  PCT Int'l Appl. ............... 357/23.11

Primary Examiner—Andrew J. James
Assistant Examiner—William A. Mintel

[57] ABSTRACT

A nonvolatile memory cell (16) is fabricated on a substrate (12) and includes a source region (46) and drain regions (48, 50 and 52). Step oxides (40, 42 and 44) are fabricated respectively over the regions (46, 48 and 52). A gate oxide (58) is formed between the step oxides (40 and 42). A thin oxide tunneling element (74) is fabricated between the step oxides (42, 44) and over the drain region (50). A floating gate (38) comprising a polysilicon layer is fabricated over the step oxides (40, 42, 44), the gate oxide (58) and the tunneling element (74). An insulation layer (36) is fabricated over the floating gate (38). Finally, a control gate (34) is fabricated over the insulating layer (36) to provide capacitive coupling to the floating gate (38). The nonvolatile memory cell (16) has enhanced capacitive coupling between the control gate (34) and the floating gate (38) while it has a minimum of capacitive coupling between the floating gate (38) and the source and drain regions (46, 48, 50, 52) in the substrate (12).

9 Claims, 5 Drawing Figures

NONVOLATILE MOS MEMORY CELL WITH TUNNELING ELEMENT

TECHNICAL FIELD

The present invention pertains in general to integrated circuits, and in particular to a memory cell having nonvolatile data storage.

BACKGROUND OF THE INVENTION

Conventional random access memories store data in a volatile manner, that is, the stored data is lost when power is removed from the memory. In many applications it is necessary that data be stored for a period of time when power is not applied to the circuit. This is termed nonvolatile storge. An example of such a nonvolatile memory cell is shown in U.S. Pat. No. 4,203,158 entitled, "Electrically Programmable and Erasable MOS Floating Gate Memory Device Employing Tunneling and Method of Fabricating Same." Design objectives for nonvolatile memory cells include minimization of area to maximize cell density, minimizing the thin oxide area used for current tunneling to reduce the susceptibility of the cell to manufacturing defects and the improvement of the capacitive coupling between the control gate and floating gate of the cell to maximize efficiency of cell area and applied voltage with respect to the current tunneling element.

In view of the above design objectives and the limitations of prior art nonvolatile memory circuits, there exists a need for such a memory circuit which maximizes the coupling to the floating gate, reduces the area and pitch of the cell and improves the reliability characteristics of the memory cell.

SUMMARY OF THE INVENTION

A selected embodiment of the present invention comprises a nonvolatile memory cell which includes a semiconductor substrate having source and drain regions implanted below the surface therein and defining a channel region between the source and drain regions. First and second step insulators are fabricated respectively over the source and drain regions. A gate insulator is fabricated on the surface of the substrate over the channel region wherein the gate insulator is thinner than the step insulators. A current tunneling element is fabricated on the substrate adjacent one of the step insulators and overlying at least a portion of either the source region or the drain region. A conductive floating gate is fabricated to extend over the gate insulator, the tunneling element and at least partially over each of the step insulators. An isolation insulator is fabricated on the surface of the floating gate wherein the isolation insulator is thinner than the step insulators. A conductive control gate is fabricated on the isolation insulator wherein the control gate capacitively couples to the floating gate.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figures 1, 2:
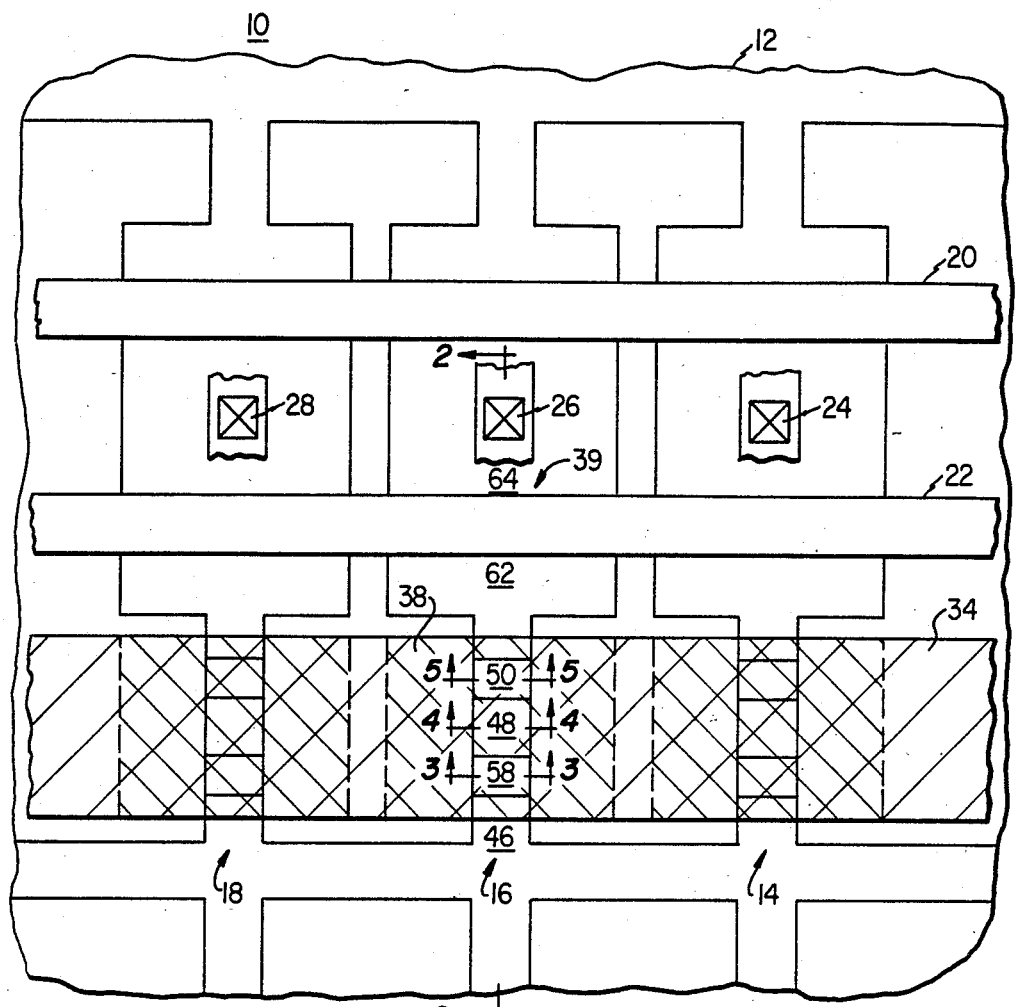
FIG. 1 is a plan view showing a plurality of nonvolatile memory cells together with a select transistor for each of the memory cells.
FIG. 2 is a sectional elevation view of one of the memory cells and the corresponding select transistor taken along the line 2—2 in FIG. 1.

An array 10 of nonvolatile memory cells is illustrated in FIG. 1. The array 10 is fabricated on a P-type silicon substrate 12 in N-channel MOS technology. There are shown three nonvolatile memory cells 14, 16 and 18 within the array 10. The cells 14, 16 and 18 are identical and the cell 16 will be described in detail as representing each of the nonvolatile memory cells within the array 10.

Polysilicon select lines 20 and 22 extend transversely across the array 10. There are further included metal contacts for bit lines 24, 26 and 28 which correspond respectively to the nonvolatile memory cells 14, 16 and 18.

There is fabricated a control gate 34 which comprises a layer of polysilicon extending over all of the nonvolatile memory cells 14, 16 and 18. The control gate 34 is shown as the upper layer in FIG. 1 and is indicated by the right-hand cross-hatch lines (as viewed from the lower to the upper portion of the page).

Immediately below the control gate 34 there is an oxidation insulation layer 36. The layer 36 is preferably silicon dioxide. The oxidation insulation layer 36 is best shown in FIGS. 2-5.

Beneath the control gate 34 and the oxidation insulation layer 36 there is provided a polysilicon floating gate 38 which comprises a part of the memory cell 16. The floating gate 38 is indicated by the left-hand cross-hatching in FIG. 1. There is a corresponding floating gate for each memory cell in the array 10.

Referring now to FIG. 2 there is illustrated a sectional elevation view of the nonvolatile memory cell 16 together with a select transistor 39 corresponding to the memory cell 16. Step oxides 40, 42 and 44 are fabricated in the substrate 12 generally extending above and below the surface thereof. However, it may be desired to fabricate planar step oxides which have the surfaces thereof parallel to the surface of the substrate. An implanted source region 46 is produced in the substrate 12 immediately below the step oxide 40. The source region 46 has an N— doping with a typical concentration of $1 \times 10^{18}/cm^3$. The cell 16 further includes a drain which comprises implanted regions 48, 50 and 52. Each of these regions has an N— doping. The regions 48, 50 and 52 are electrically connected together.

A region 54 comprises a ground line for the memory cells and is electrically connected to the source region 46.

Between the respective source and drain regions 46 and 48 there is defined in the substrate 12 a channel region 58.

There is further shown in FIGS. 1 and 2 the select transistor 39 which has an implanted source region 62, an implanted drain region 64 and a channel region 66 between the regions 62 and 64.

A gate oxide 72 is fabricated above the channel 58 on the surface of the substrate 12 between the step oxides 40 and 42. A tunnel oxide 74, typically 100 angstroms thick, is fabricated on the surface of the substrate 12 above drain region 50 and between the step oxides 42 and 44. In general, the tunneling element is a dielectric and materials other than oxides can be used, for example, nitrides or oxynitrides.

The locations of the source region 46, channel region 58, drain region 48 and tunnel oxide 50 in the memory cell 16 are shown in the plan view of FIG. 1.

Figure 3:
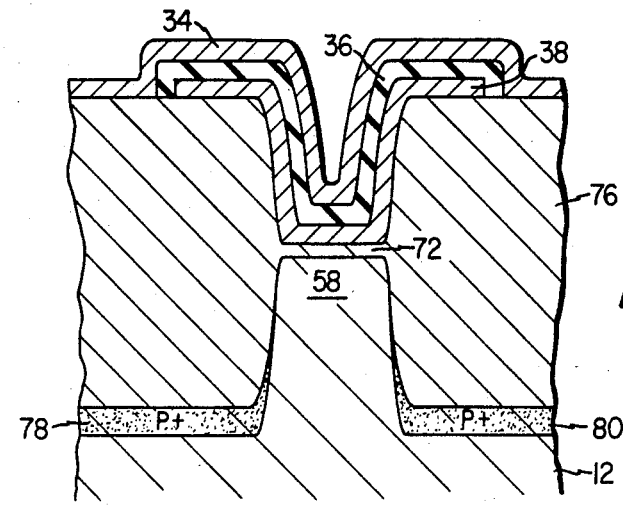
FIG. 3 is a sectional elevation view of the channel region of the memory cell taken along the line 3—3 in FIG. 1.
Figure 4:
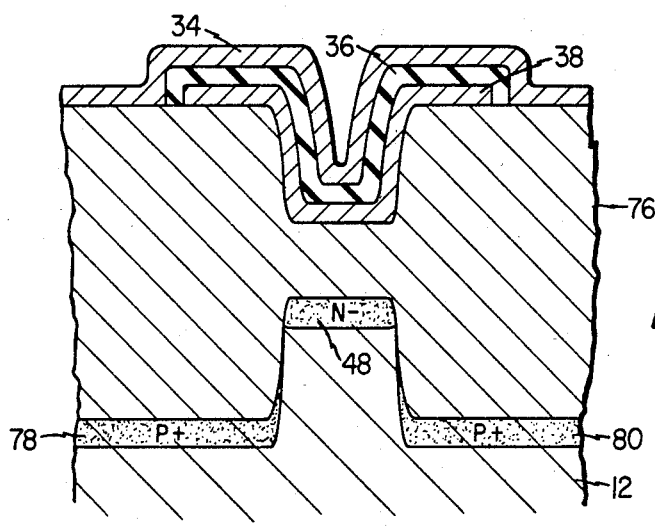
FIG. 4 is a sectional elevation view showing the drain region of the nonvolatile memory cell taken along the line 4—4 in FIG. 1.
Figure 5:
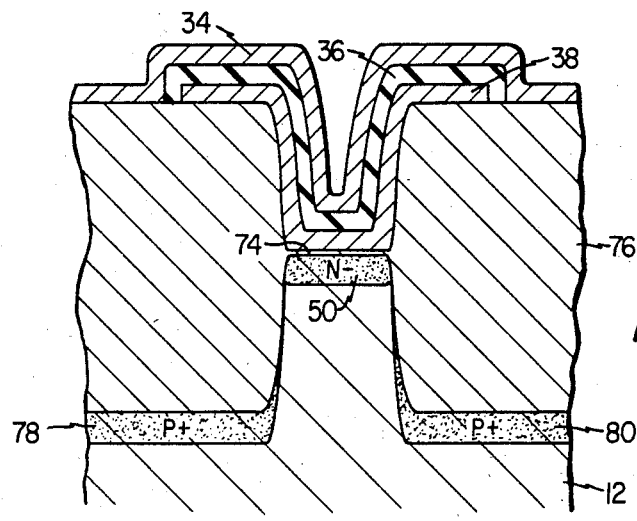
FIG. 5 is a sectional elevation view showing the current tunneling element region of the nonvolatile memory cell taken along the line 5—5 illustrated in FIG. 1.

Further referring to the figures, FIG. 3 is a section view taken through the channel region 58 of the memory cell 16. FIG. 4 is a sectional view taken through the drain region 48 of the cell 16. FIG. 5 is a sectional view taken through the tunnel oxide 74 of the cell 16. In FIGS. 3-5 there is shown field oxide 76 which is grown on the substrate 12 to define the active areas in the array 10. There are further provided channel stop implants 78 and 80, having a P+ doping, to limit the active areas of the array 10.

In a selected embodiment of the present invention, the various elements of the nonvolatile memory cell 16 are fabricated to have the following thicknesses:

| Control Gate 34 | 4,000 angstroms |
| Isolation Oxidation 36 | 500 angstroms |
| Floating Gate 38 | 2,000 angstroms |
| Step Oxide 40, 42, 44 | 5,000 angstroms |
| Gate Oxide 58 | 500 angstroms |
| Tunneling Element 74 | 100 angstroms |
| Field Oxide 76 | 10,000 angstroms |

Operation of the nonvolatile memory cell 16 together with the select transistor 39 is now described in reference to the figures and in particular to FIG. 2. There are three modes of operation for the nonvolatile memory cell. These are erase, program and read. The erase mode is always carried out immediately prior to the program mode.

In the erase mode the select line 22, which is the gate terminal of transistor 39, is driven to a 20 volt level. The bit line 26 is pulled to ground, 0 volts. The control gate 34 is also driven to a 20 volt level. The voltage applied to the select line 22 renders transistor 39 conductive, thereby pulling the source region 62 to ground. Region 62 is electrically connected to the drain regions 48, 50 and 52. The 20 volt state at the control gate 34 is substantially coupled to the floating gate 38. There is thus produced a high voltage across the tunneling element 74. Since the floating gate 38 is at a higher potential than the region 50, electrons are tunneled from the region 50 through the element 74 to the gate 38 thereby producing a negative charge on the floating gate 38. When the voltage at the control gate 34 and consequently at the floating gate 38 is reduced, the tunneling through the element 74 is terminated, trapping a net negative charge on the floating gate 38. The net negative charge on the floating gate 38 tends to render the memory cell 16 nonconductive between its source region 46 and drain region 48. This is the erase state.

For the program state, the select line 22 is driven to 20 volts and the control gate 34 is pulled to ground. The bit line 26 is driven to either 0 volts or 20 volts depending on the desired data state to be stored in the memory cell 16. When a 0 voltage state is applied to line 26, the drain region 50 is driven to a 0 volt level. The floating gate 38 is likewise at a low voltage state since there is no high voltage coupling from the control gate 34. There is thus no voltage potential coupled across the tunneling element 74. Thus, the floating gate 38 will remain with its net negative charge produced by the erase mode.

When a 20 volt level is applied to the bit line 26, the drain region 50 will likewise be driven to approximately 20 volts. The floating gate is at essentially a low potential since there is no high voltage coupling from the control gate 34. As a result, there is a relatively large potential of approximately 12 volts developed across the tunneling element 74. Since the drain region 50 is at a higher potential than the floating gate 38 there will be a net flow of electrons from the gate 38 to the region 50. This will produce a net positive charge on the floating gate 38. When the floating gate 38 goes to a positive state the transistor comprising memory cell 16 will become conductive and attempt to pass a substantial current to the ground region 54. To prevent this occurrence the voltage at the ground region 54 is either floated or raised typically from 0 to 5 volts preventing the memory cell 16 from becoming highly conductive when the floating gate initially gains a net positive charge. Consequently this allows a net positive voltage on the floating gate during the read operation.

In the read mode, the select line 22 is driven to 5 volts to select memory cell 16 while the control gate 34 is maintained at a reference potential, preferably at ground. The bit line 26 is maintained at a positive voltage typically 2.5 volts, through a load element. If the floating gate 38 has been charged to a net positive condition, the memory cell 16 will be conductive and will pull the bit line 26 toward ground via ground region 54. A sense amplifier, not shown, is connected to the bit line 26 to detect its discharge and thereby determine the data state stored in the memory cell 16. If a net negative charge has been stored on the floating gate 38, the memory cell 16 will not be conductive and the bit line 26 will not be discharged and the sense amplifier, not shown, will thereby indicate the opposite data state.

A principal concern in the operation of a nonvolatile memory cell utilizing the Fowler-Nordheim tunneling mechanism is the raising of the floating gate to a sufficiently high voltage. The amount of the voltage transferred from the control gate 34 to the floating gate 38 is proportional to the ratio of the capacitance between the control gate 34 and floating gate 38 to the total floating gate capacitance, which includes capacitance between the floating gate 38 and the regions in the substrate 12. The greater this ratio, the greater will be the voltage capacitively coupled to the floating gate 38. A principal advantage of the present invention is that with the greater coupling ratio the areas of the elements comprising the memory cell 16 can be reduced while still maintaining sufficient voltage margins at the floating gate 38.

The tunneling element 74 comprises an insulator in a capacitor which has the floating gate 38 as a first plate and the drain region 50 as a second plate. Since the tunneling element 74 is extremely thin, less than 200 angstroms, the capacitive coupling per unit of area of the tunneling element will be substantially greater than the coupling per unit of area between the control gate 34 and floating gate 38. Therefore, the tunneling element is designed to have a minimum area as determined by the manufacturing process used to produce the integrated circuit.

The capacitive coupling between the floating gate 38 and the regions in the substrate 12 is reduced in the present invention by the separating of the floating gate 38 from the regions 46, 48 and 52 by the step oxides 40, 42 and 44.

The capacitive coupling between the control gate 34 and the floating gate 38 is increased by increasing the overlap area of these two gates. This overlap area is substantially increased, in comparison with the prior art, by extending the floating gate over the source and drain regions of the memory cell 16 and then extending the control gate 34 over the expanded areas of the floating gate 38. This configuration produces an enhanced coupling ratio to maximize the voltage across the tunneling element 74 or to minimize the area of the nonvolatile memory cell 16.

The memory cell 16 and the select transistor 39 are configured in a linear arrangement to minimize the pitch for each memory cell, thereby increasing the density for the overall circuit.

In summary, the present invention comprises a nonvolatile memory cell in which the coupling from the control gate to the floating gate is increased without increasing cell area or substantially increasing capacitive coupling of the floating gate to the substrate. The configuration of the nonvolatile memory cell is essentially linear with a minimum area so that a maximum density of such cells can be fabricated in a memory circuit.

Although one embodiment of the invention has been illustrated in the accompanying drawings and described in the foregoing Detailed Description, it will be understood that the invention is not limited to the embodiment disclosed but is capable of numerous rearrangements, modifications and substitutions without departing from the scope of the invention.

I claim:

1. A nonvolatile memory cell, comprising:
    a semiconductor substrate,
    source and drain regions implanted in said substrate below the surface thereof and defining a channel region therebetween,
    first and second step insulators fabricated respectively over said source and said drain regions,
    a gate insulator fabricated on said substrate over said channel region,
    a tunneling element fabricated on said substrate adjacent a side of one of said step insulators that is farthest from said gate insulator and overlying at least a portion of one of said regions,
    a conductive floating gate fabricated to extend over said gate insulator, said tunneling element and at least partially over each of said step insulators,
    an isolation insulator fabricated on said floating gate, and
    a conductive control gate fabricated on said isolation insulator wherein said control gate is capacitively coupled to said floating gate.

2. A nonvolatile memory cell as recited in claim 1 including a third step insulator fabricated over a portion of the one of said regions beneath said floating gate, said tunneling element between said second and third step insulators.

3. A nonvolatile memory cell as recited in claim 1 wherein said gate insulator and said current tunneling element are thinner than said step insulators.

4. A nonvolatile memory cell as recited in claim 1 wherein said first and second step insulators and said gate insulator are oxides.

5. A nonvolatile memory cell as recited in claim 1 wherein said tunneling element is a dielectric.

6. A nonvolatile memory cell as recited in claim 1 wherein said tunneling element is an oxide.

7. A nonvolatile memory cell comprising:
    a semiconductor substrate,
    a source region formed in said substrate below and adjacent to the surface thereof,
    a first step oxide formed from said substrate above said source region.
    a first drain region formed in said substrate below and adjacent to the surface thereof,
    a second step oxide formed from said substrate above said first drain region, said second step oxide laterally offset from said first step oxide and defining a channel region therebetween,
    a gate oxide formed on the surface of said substrate between said first and second step oxides,
    a second drain region in said substrate at the surface thereof adjacent said second step oxide,
    a third drain region formed in said substrate below and adjacent to the surface thereof, said first, second and third drain regions electrically connected,
    a third step oxide formed from said substrate above said third drain region, said first, second and third step oxides,
    a tunneling element fabricated on the surface of said substrate over said second drain region between said second and third step oxides,
    a conductive floating gate fabricated on the surface of said gate oxide, said tunneling element, said second step oxide and at least portions of said first and third step oxides,
    an insulation layer fabricated over said floating gate, and
    a conductive control gate fabricated over said insulation layer, wherein said control gate is capacitively coupled to said floating gate.

8. A nonvolatile memory cell as recited in claim 7 wherein said tunneling element is a dielectric layer thinner than said gate oxide and said gate oxide is thinner than said step oxide.

9. A nonvolatile memory cell as recited in claim 7 wherein each of said step oxides extends to above the surface of said substrate.

* * * * *